US008828803B2

(12) United States Patent
Priewasser (10) Patent No.: US 8,828,803 B2
(45) Date of Patent: Sep. 9, 2014

(54) RESIN SEALING METHOD FOR SEMICONDUCTOR CHIPS

(71) Applicant: Disco Corporation, Tokyo (JP)

(72) Inventor: Karl Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/931,039

(22) Filed: Jun. 28, 2013

(65) Prior Publication Data

US 2014/0004658 A1  Jan. 2, 2014

(30) Foreign Application Priority Data

Jun. 28, 2012 (JP) ................... 2012-145956

(51) Int. Cl.
  *H01L 21/00* (2006.01)
  *H01L 21/302* (2006.01)
  *H01L 21/461* (2006.01)
  *H01L 23/00* (2006.01)
  *H01L 21/56* (2006.01)

(52) U.S. Cl.
  CPC ............... *H01L 21/56* (2013.01); *H01L 24/96* (2013.01); *H01L 21/568* (2013.01); *H01L 21/565* (2013.01); *H01L 21/561* (2013.01)
  USPC ........... 438/118; 438/704; 438/124; 438/127; 438/460; 438/6

(58) Field of Classification Search
  USPC ........ 438/460, 6, 704; 257/E21.503, E21.508
  See application file for complete search history.

(56) References Cited

U.S. PATENT DOCUMENTS

| 6,462,415 | B1 * | 10/2002 | Ishiguri et al. | 257/738 |
| 6,624,003 | B1 * | 9/2003 | Rice | 438/106 |
| 7,112,467 | B2 * | 9/2006 | Eichelberger et al. | 438/106 |
| 2005/0206014 | A1 * | 9/2005 | Sakamoto et al. | 257/782 |
| 2007/0037321 | A1 * | 2/2007 | Higashino et al. | 438/109 |
| 2007/0218651 | A1 * | 9/2007 | Higashino | 438/460 |
| 2013/0302969 | A1 * | 11/2013 | Priewasser | 438/458 |

FOREIGN PATENT DOCUMENTS

JP  08-078566  3/1996

* cited by examiner

*Primary Examiner* — Evan Pert
*Assistant Examiner* — Gustavo Ramallo
(74) *Attorney, Agent, or Firm* — Greer Burns & Crain Ltd.

(57) ABSTRACT

A resin sealing method for a plurality of semiconductor chips. The resin sealing method includes a chip holding sheet attaching step of attaching a chip holding sheet through an adhesive ring to a support substrate, a semiconductor chip attaching step of attaching the front side of each semiconductor chip to an adhesive layer constituting the chip holding sheet in an area corresponding to the inside of the adhesive ring, a resin sealing step of sealing all of the semiconductor chips with a mold resin, a support substrate removing step of removing the support substrate from the chip holding sheet on which the semiconductor chips are attached and sealed with the mold resin, and a chip holding sheet peeling step of peeling the chip holding sheet from the front side of each semiconductor chip sealed with the mold resin.

6 Claims, 8 Drawing Sheets

RESIN SEALING METHOD FOR SEMICONDUCTOR CHIPS

BACKGROUND OF THE INVENTION

1. Field of the Invention

The present invention relates to a resin sealing method for sealing a plurality of semiconductor chips with a resin.

2. Description of the Related Art

A manufacturing method for an area package type semiconductor unit is disclosed in Japanese Patent Laid-open No. Hei 08-078566, for example. The area package type semiconductor unit includes a substrate such as a resin substrate formed of glass fiber based epoxy resin, for example, semiconductor chips fixed to the front side of the substrate, external electrodes provided on the back side of the substrate so as to be arranged like a grid array, and a sealing member such as a mold resin for sealing the semiconductor chips on the front side of the substrate.

SUMMARY OF THE INVENTION

However, in sealing the semiconductor chips with the mold resin, the semiconductor chips are attached through a thermally releasable tape to a support substrate formed of steel, and the mold resin is next applied to the support substrate so as to seal the semiconductor chips. Accordingly, much time is required to remove the support substrate from the mold resin after sealing the semiconductor chips with the mold resin. Further, an adhesive material of the thermally releasable tape may be left on the surface of each semiconductor chip after removing the support substrate.

It is therefore an object of the present invention to provide a resin sealing method for a plurality of semiconductor chips which can facilitate the removal of the support substrate in sealing the semiconductor chips with the mold resin, thereby shortening the manufacturing time.

In accordance with an aspect of the present invention, there is provided a resin sealing method for a plurality of semiconductor chips, including a chip holding sheet attaching step of attaching a chip holding sheet through an adhesive ring to a platelike support substrate, the chip holding sheet having a base and an adhesive layer formed on the front side of the base, the adhesive ring having an outer size equal to that of the chip holding sheet, the support substrate having an outer size larger than that of the chip holding sheet; a semiconductor chip attaching step of attaching the front side of each semiconductor chip to the adhesive layer of the chip holding sheet in an area corresponding to the inside of the adhesive ring after performing the chip holding sheet attaching step; a resin sealing step of sealing all of the semiconductor chips with a mold resin after performing the semiconductor chip attaching step; a support substrate removing step of removing an adhesive force of the adhesive ring to the chip holding sheet after performing the resin sealing step, thereby removing the support substrate from the chip holding sheet on which the semiconductor chips are attached and sealed with the mold resin; and a chip holding sheet peeling step of peeling the chip holding sheet from the front side of each semiconductor chip sealed with the mold resin after performing the support substrate removing step.

Preferably, the resin sealing method further includes a grinding step of grinding the mold resin in the condition where the chip holding sheet is held on a holding table after performing the support substrate removing step, thereby reducing the thickness of the mold resin until each semiconductor chip is exposed.

Preferably, the support substrate has a ring groove having a shape corresponding to the shape of the adhesive ring on the front side of the support substrate, and the ring groove is filled with the adhesive ring. As a modification, the adhesive ring is mounted on the back side of the base of the chip holding sheet opposite to the adhesive layer along the outer circumference of the base.

Preferably, the adhesive ring is formed of an ultraviolet curing adhesive, and the support substrate removing step includes the step of applying ultraviolet light to the adhesive ring to cure the adhesive ring, thereby removing the adhesive force of the adhesive ring.

Preferably, the support substrate removing step includes the step of cutting the chip holding sheet along the inner circumference of the adhesive ring by using a cutting blade, thereby removing the adhesive force of the adhesive ring.

According to the resin sealing method of the present invention, the chip holding sheet is attached through the adhesive ring to the support substrate, and the plural semiconductor chips attached to the chip holding sheet are sealed with the mold resin. Accordingly, the mold resin and the chip holding sheet can be separated from the support substrate by simply removing the adhesive force of the adhesive ring. Since the area occupied by the adhesive ring on the support substrate is small, the mold resin and the chip holding sheet can be easily separated from the support substrate.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1A:
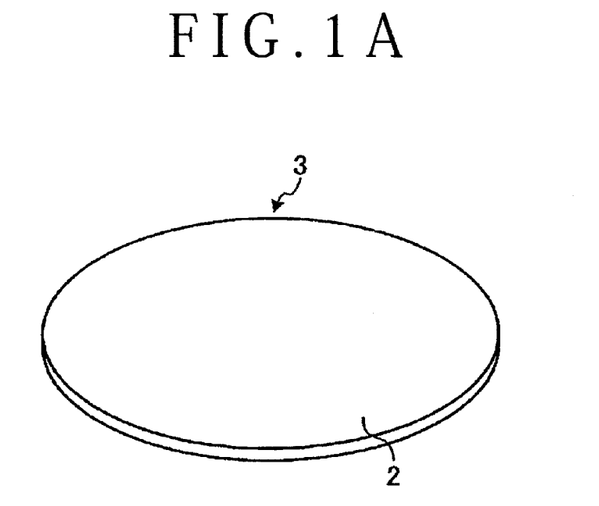
FIG. 1A is a perspective view of a semiconductor unit obtained by a preferred embodiment of the resin sealing method according to the present invention.
Figure 1B:
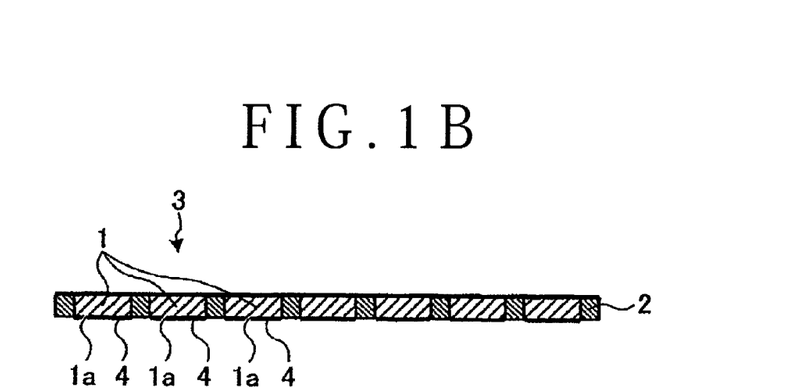
FIG. 1B is a sectional view of the semiconductor unit shown in FIG. 1A.

The resin sealing method according to this preferred embodiment is a method of sealing a plurality of semiconductor chips 1 shown in FIG. 1B with a mold resin 2 to form a semiconductor unit 3 (corresponding to a package) shown in FIGS. 1A and 1B. As shown in FIGS. 1A and 1B, the semiconductor unit 3 obtained by the resin sealing method according to this preferred embodiment is a disk-shaped object and it includes the plural semiconductor chips 1 and the mold resin 2 covering the plural semiconductor chips 1 except their patterned surfaces 1a (corresponding to the front side) where terminals are formed. Each semiconductor chip 1 is obtained by forming an IC or LSI such as memory, logic, gate array, custum, and power transistor on a semiconductor wafer of Si or GaAs, for example. As described above, terminals are formed on the patterned surface 1a of each semiconductor chip 1. Further, a wiring layer 4 configured by bumps connected to the terminals is formed on the patterned surface 1a of each semiconductor chip 1. The mold resin 2 is formed from a resin moldable at a predetermined molding temperature by a molding process.

Figure 2A:
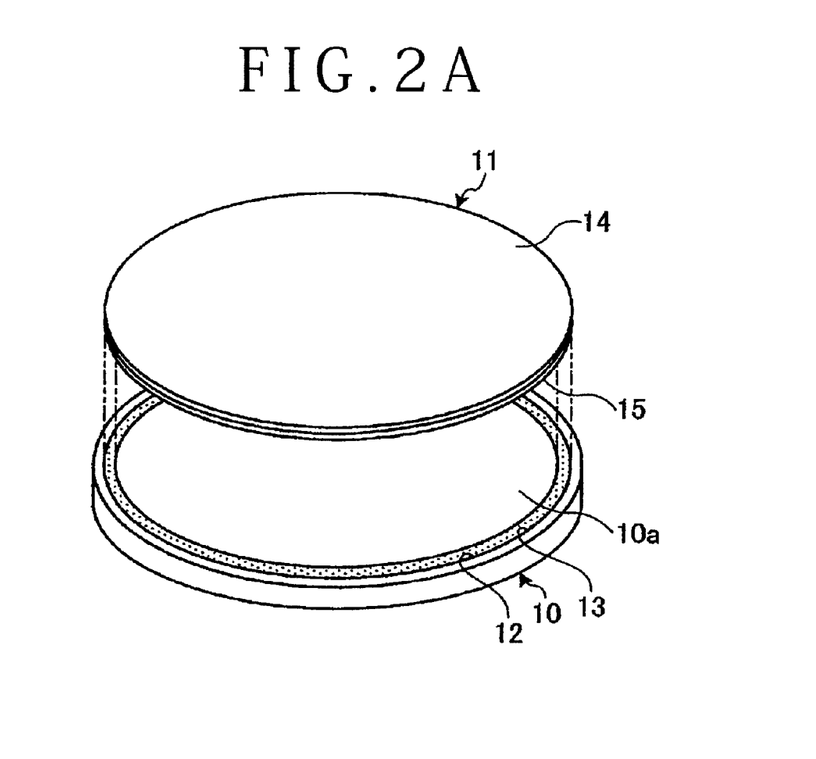
FIG. 2A is a perspective view showing a chip holding sheet attaching step in this preferred embodiment.
Figure 2B:
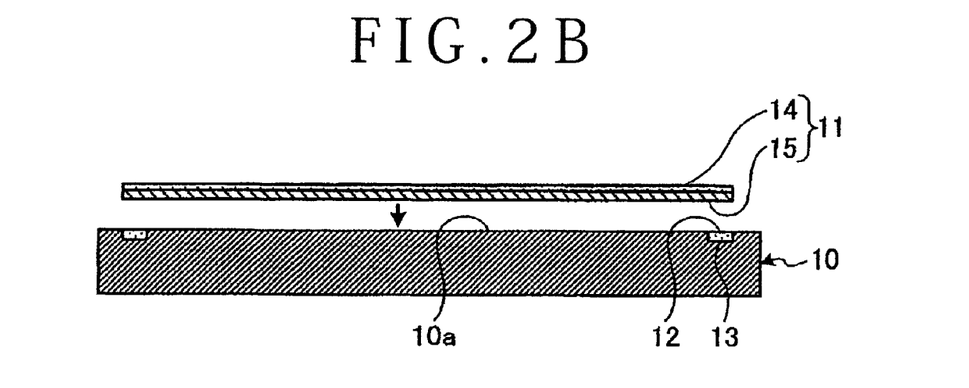
FIG. 2B is a sectional view of a chip holding sheet, a support substrate, and an adhesive ring shown in FIG. 2A.

The resin sealing method according to this preferred embodiment employs a support substrate 10 and a chip holding sheet 11 shown in FIGS. 2A and 2B. The support substrate 10 is formed of metal (e.g., iron) or resin, for example. As shown in FIGS. 2A and 2B, the support substrate 10 is a plate member larger in outer size than the chip holding sheet 11. More specifically, the support substrate 10 is a circular plate member and the chip holding sheet 11 is a circular sheet member, wherein the diameter of the support substrate 10 is larger than that of the chip holding sheet 11. A ring groove 13 for receiving an adhesive ring 12 is formed on the front side (upper surface) 10a of the support substrate 10 along the entire circumference thereof. The ring groove 13 has an outer size equal to that of the chip holding sheet 11. The ring groove 13 is formed at only the outer circumferential portion on the front side 10a of the support substrate 10. More specifically, the ring groove 13 is an annular groove having an outer diameter equal to the diameter of the chip holding sheet 11. The adhesive ring 12 received in the ring groove 13 is formed of an ordinary adhesive or an ultraviolet curing adhesive.

As shown in FIGS. 2A and 2B, the chip holding sheet 11 is composed of a base 15 and an adhesive layer 14 formed on the front side (upper surface) of the base 15 for attaching the semiconductor chips 1 thereon. The adhesive layer 14 is formed by applying an adhesive to the entire surface on the front side of the base 15. The adhesive layer 14 is formed of a photocuring adhesive that can be cured by ultraviolet light or visible light. More specifically, the adhesive layer 14 is formed of an ultraviolet curing adhesive that can be cured by ultraviolet light. The base 15 is formed of a transparent or translucent synthetic resin capable of transmitting ultraviolet light or visible light. More specifically, the base 15 is formed of a synthetic resin capable of transmitting ultraviolet light.

As described above, the chip holding sheet 11 is a circular sheet member in this preferred embodiment.

Figure 3:
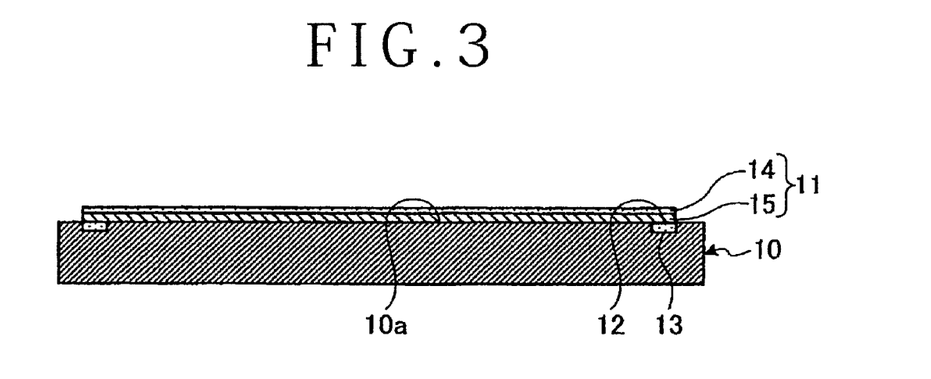
FIG. 3 is a sectional view of the chip holding sheet attached through the adhesive ring to the support substrate by the chip holding sheet attaching step.

The resin sealing method according to this preferred embodiment is performed in the following manner. First, the adhesive ring 12 is filled in the ring groove 13 of the support substrate 10 so that the upper surface of the adhesive ring 12 is flush with the front side 10a of the support substrate 10. Thereafter, a chip holding sheet attaching step is performed as shown in FIGS. 2A and 2B in such a manner that the chip holding sheet 11 is attached through the adhesive ring 12 to the support substrate 10. More specifically, the base 15 of the chip holding sheet 11 is placed on the front side 10a of the support substrate 10 so that the chip holding sheet 11 is aligned with the support substrate 10. Accordingly, the outer circumferential portion of the chip holding sheet 11 is placed on the adhesive ring 12 filled in the ring groove 13. FIG. 3 shows a condition obtained by performing the chip holding sheet attaching step. As shown in FIG. 3, the chip holding sheet 11 is attached through the adhesive ring 12 to the support substrate 10 in the condition that the base 15 of the chip holding sheet 11 is in contact with the front side 10a of the support substrate 10. Since the outer diameter of the adhesive ring 12 is equal to the diameter of the chip holding sheet 11, only the outer circumferential portion of the base 15 of the chip holding sheet 11 is attached through the adhesive ring 12 to the support substrate 10.

Figure 4:
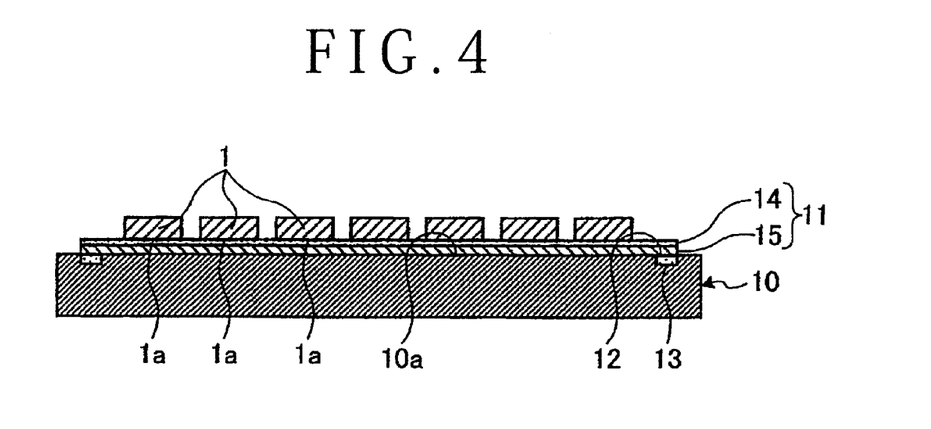
FIG. 4 is a sectional view showing a semiconductor chip attaching step in this preferred embodiment.

After performing the chip holding sheet attaching step mentioned above, a semiconductor chip attaching step is performed as shown in FIG. 4 in such a manner that the patterned surface 1a of each semiconductor chip 1 is attached to the adhesive layer 14 of the chip holding sheet 11 in an area corresponding to the inside of the adhesive ring 12.

Figure 5:
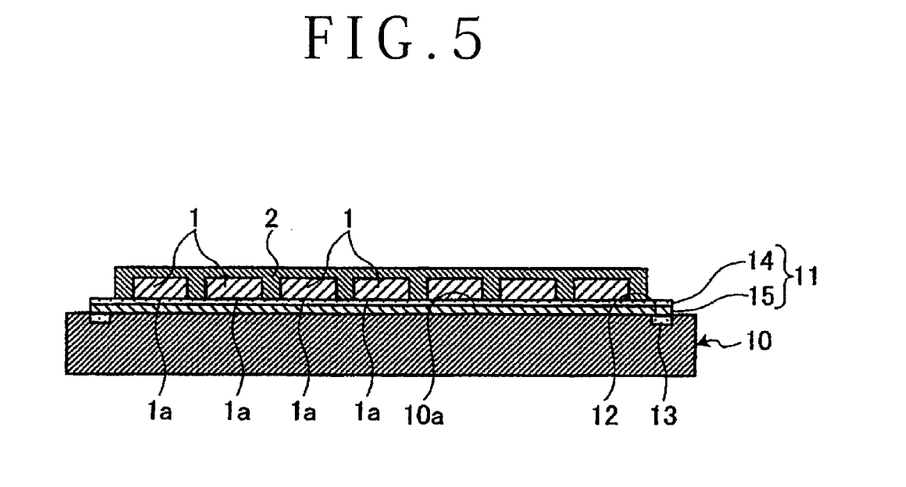
FIG. 5 is a sectional view showing a resin sealing step in this preferred embodiment.

After performing the semiconductor chip attaching step mentioned above, a resin sealing step is performed as shown in FIG. 5 in such a manner that all of the plural semiconductor chips 1 are sealed with the mold resin 2. More specifically, the mold resin 2 is formed on the chip holding sheet 11 in an area corresponding to the inside of the adhesive ring 12 so as to fully cover all of the plural semiconductor chips 1 by a molding process. Accordingly, the all of the plural semiconductor chips 1 attached to the chip holding sheet 11 in the area corresponding to the inside of the adhesive ring 12 are sealed with the mold resin 2.

Figure 6:
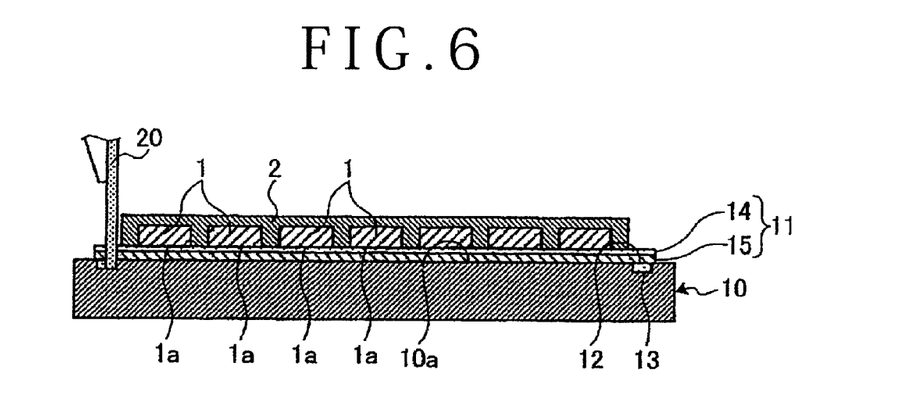
FIG. 6 is a sectional view showing a support substrate removing step in this preferred embodiment.

After performing the resin sealing step mentioned above, a support substrate removing step is performed as shown in FIG. 6 in such a manner that the chip holding sheet 11 is cut along the entire inner circumference of the adhesive ring 12 by using a cutting blade 20. Accordingly, an adhesive force of the adhesive ring 12 to the chip holding sheet 11 is removed to thereby remove the support substrate 10 together with the adhesive ring 12 from the chip holding sheet 11 on which the plural semiconductor chips 1 are attached and sealed with the mold resin 2.

Figure 7:
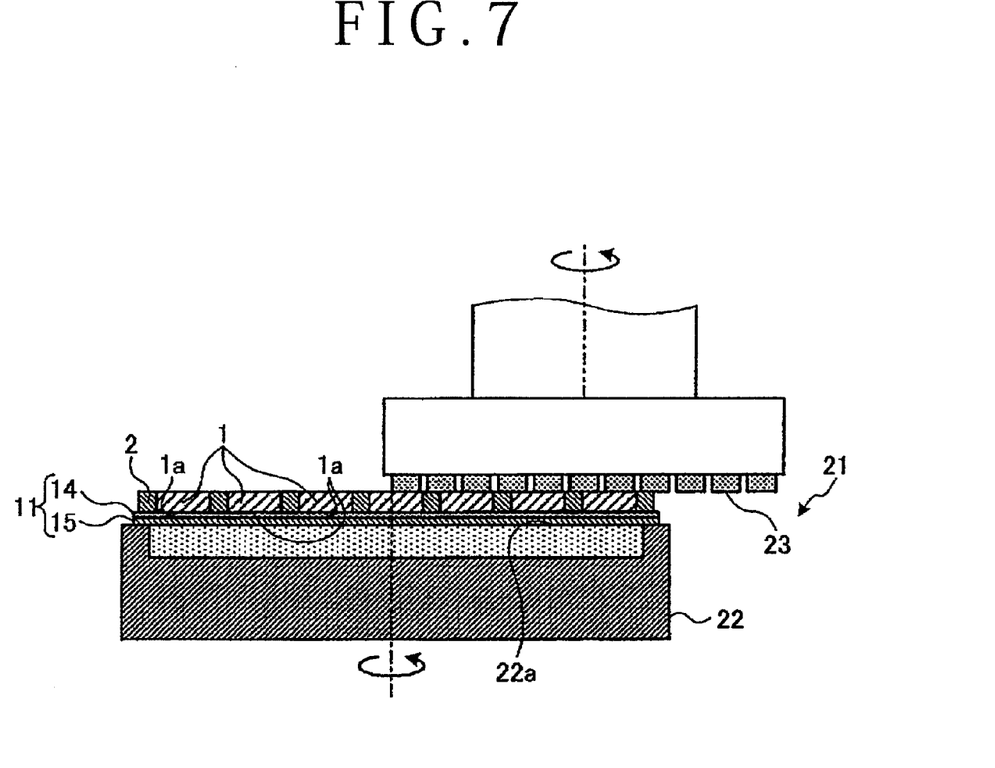
FIG. 7 is a sectional view showing a grinding step in this preferred embodiment.

After performing the support substrate removing step mentioned above, a grinding step is performed as shown in FIG. 7 in the following manner. The mold resin 2 sealing the plural semiconductor chips 1 is transported together with the chip holding sheet 11 to a holding table 22 of a grinding apparatus 21 shown in FIG. 7 by using transporting means (not shown). Thus, the plural semiconductor chips 1 attached to the chip holding sheet 11 and sealed with the mold resin 2 are placed on the holding table 22 in the condition where the chip holding sheet 11 is in contact with the holding table 22 and the mold resin 2 is exposed. In this condition, the chip holding sheet 11 is held on the holding table 22 under suction and the mold resin 2 is ground by using abrasive members 23 constituting the grinding apparatus 21 to thereby reduce the thickness of the mold resin 2 until the plural semiconductor chips 1 are exposed. As shown in FIG. 7, the grinding apparatus 21 used in this grinding step essentially includes the holding table 22 for holding the mold resin 2 through the chip holding sheet 11 and the abrasive members 23 for grinding the mold resin 2 held on the holding table 22 to thereby reduce the thickness of the mold resin 2 to a finished thickness. The holding table 22 has a circular holding surface 22a formed of a porous ceramic material or the like. The holding surface 22a is connected through a vacuum line (not shown) to a vacuum source (not shown), thereby holding the mold resin 2 through the chip holding sheet 11 on the holding surface 22a under suction. Further, the holding table 22 is rotatable about its axis by a rotational drive source (not shown). In grinding the mold resin 2, the holding table 22 holding the mold resin 2 is rotated by the rotational drive source, and the abrasive members 23 are also rotated in the same direction as the direction of rotation of the holding table 22.

Figure 8A:
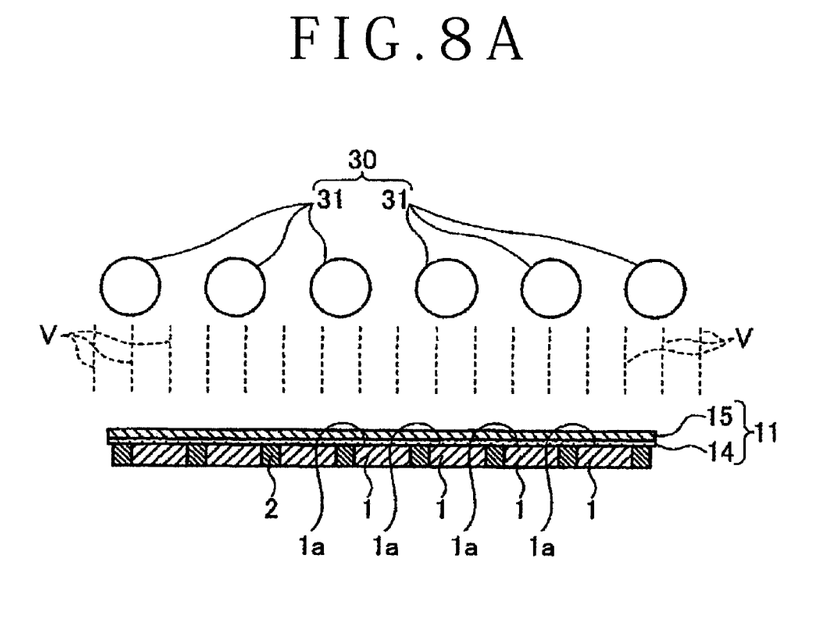
FIGS. 8A and 8B are sectional views showing a chip holding sheet peeling step in this preferred embodiment.
Figure 8B:
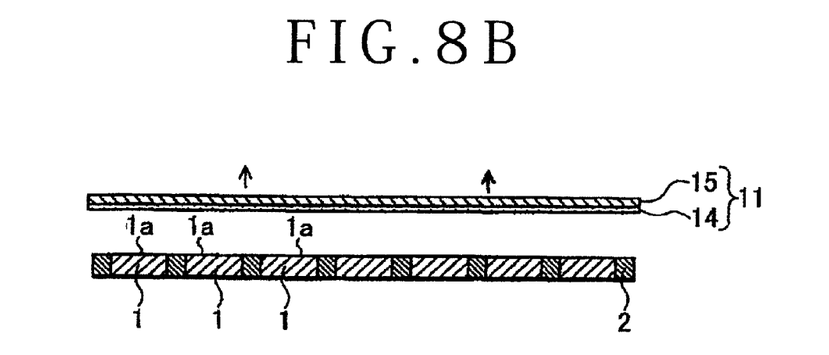

After performing the grinding step mentioned above, a chip holding sheet peeling step is performed as shown in FIGS. 8A and 8B in the following manner. As shown in FIG. 8A, the mold resin 2 and the chip holding sheet 11 are transported to ultraviolet applying means 30 to make the chip holding sheet 11 be opposed to a plurality of ultraviolet lamps 31 constituting the ultraviolet applying means 30. In this condition, ultraviolet light V is applied from the ultraviolet lamps 31 of the ultraviolet applying means 30 through the base 15 of the chip holding sheet 11 to the adhesive layer 14 of the chip holding sheet 11. As a result, the adhesive layer 14 adhering to the patterned surface 1a of each semiconductor chip 1 is cured by the ultraviolet light V to thereby reduce an adhesive force of the adhesive layer 14 of the chip holding sheet 11. Thereafter, as shown in FIG. 8B, the chip holding sheet 11 is peeled from the patterned surface 1a of each semiconductor chip 1 sealed with the mold resin 2.

Figure 9:
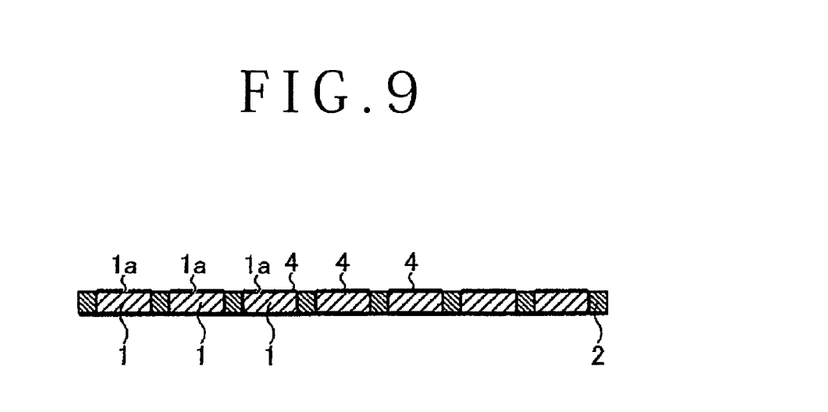
FIG. 9 is a sectional view showing a rewiring layer forming step in this preferred embodiment.

After performing the chip holding sheet peeling step mentioned above, a rewiring layer forming step is performed as shown in FIG. 9 in such a manner that bumps or the like are connected to the terminals on the patterned surface 1a of each semiconductor chip 1 sealed with the mold resin 2, thereby forming the wiring layer 4 on the patterned surface 1a. In this manner, the semiconductor unit 3 described above with reference to FIGS. 1A and 1B is obtained.

In the resin sealing method according to this preferred embodiment described above, the chip holding sheet 11 is attached through the adhesive ring 12 to the support substrate 10, and the plural semiconductor chips 1 are next attached to the chip holding sheet 11. Thereafter, the plural semiconductor chips 1 are sealed with the mold resin 2. Accordingly, by simply removing the adhesive force of the adhesive ring 12, the mold resin 2 and the chip holding sheet 11 can be separated from the support substrate 10. As a result, manufacturing time can be shortened and working efficiency can also be improved in manufacturing the semiconductor unit 3. Further, in the support substrate removing step, the cutting blade 20 is used to cut the chip holding sheet 11 along the inner circumference of the adhesive ring 12. Accordingly, the chip holding sheet 11 can be separated from the support substrate 10 without leaving the adhesive ring 12 on the chip holding sheet 11. Accordingly, the next grinding step can be performed in the condition where the chip holding sheet 11 attached to the mold resin 2 is held on the holding table 22 of the grinding apparatus 21. In this condition, the mold resin 2 is ground by the adhesive members 23 of the grinding apparatus 21. Accordingly, the chip holding sheet 11 can be used as a protective tape for protecting the patterned surface 1a of each semiconductor chip 1 in the grinding step. That is, in performing the grinding step, the mold resin 2 need not be transferred to a dedicated protective tape, thereby further shortening the manufacturing time and further improving the working efficiency in manufacturing the semiconductor unit 3.

Further, the adhesive layer 14 of the chip holding sheet 11 is formed of an ultraviolet curing adhesive, and in the chip holding sheet peeling step, the adhesive layer 14 is cured by applying ultraviolet light V. Accordingly, it is possible to suppress that the adhesive layer 14 of the chip holding sheet 11 peeled in the chip holding sheet peeling step may be left on the patterned surface 1a of each semiconductor chip 1. In the case that even a part of the adhesive ring 12 is left on the base 15 of the chip holding sheet 11 after the support substrate removing step, the adhesive ring 12 left on the base 15 of the chip holding sheet 11 is preferably removed before the grinding step.

Figure 10:
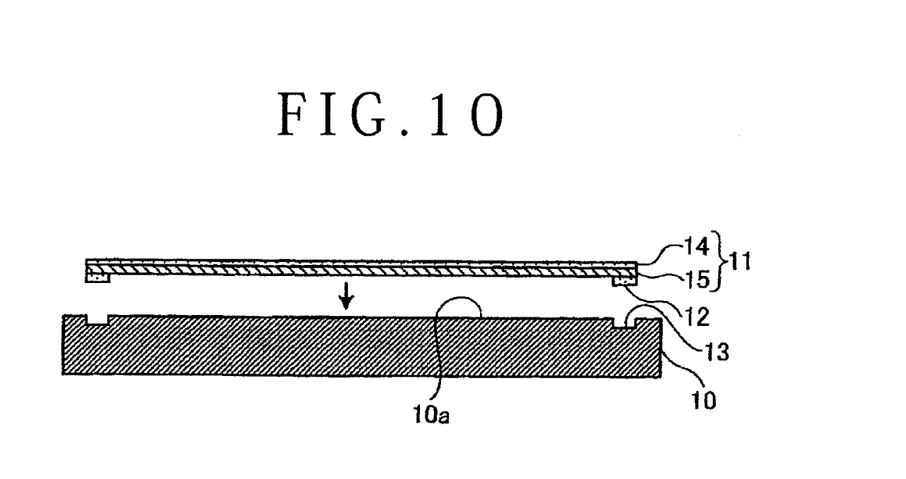
FIG. 10 is a sectional view showing a modification of the chip holding sheet attaching step.

While the adhesive ring 12 is filled in the ring groove 13 formed on the front side 10a of the support substrate 10 in this preferred embodiment, the adhesive ring 12 may be preliminarily mounted on the back side (lower surface) of the base 15 opposite to the adhesive layer 14 along the entire outer circumference of the base 15 as shown in FIG. 10. That is, FIG. 10 is a sectional view showing a modification of the chip holding sheet attaching step. In this modification, the chip holding sheet 11 includes the base 15, the adhesive layer 14, and the adhesive ring 12 mounted on the back side of the base 15 opposite to the adhesive layer 14 along the entire outer circumference of the base 15. According to this modification shown in FIG. 10, the adhesive ring 12 need not be filled in the ring groove 13 formed on the support substrate 10 before performing the chip holding sheet attaching step, so that the chip holding sheet attaching step can be easily performed by simply attaching the chip holding sheet 11 through the adhesive ring 12 to the support substrate 10.

Figure 11:
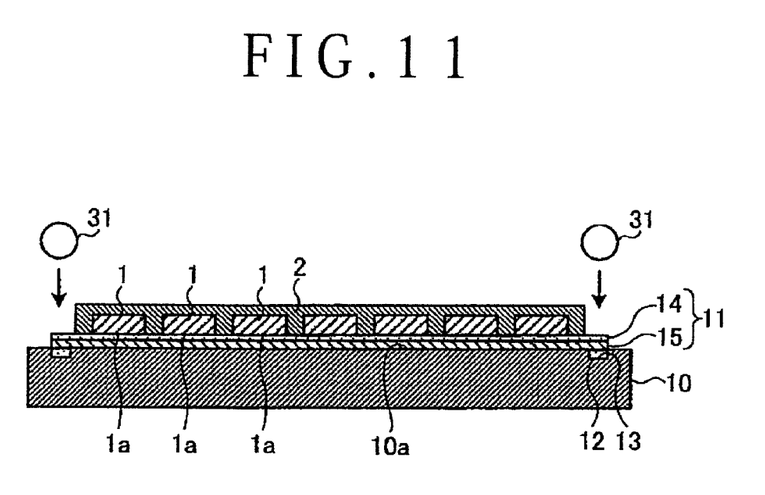
FIG. 11 is a sectional view showing a modification of the support substrate removing step.

In this preferred embodiment, the adhesive ring 12 may be formed of an ultraviolet curing adhesive as shown in FIG. 11. That is, FIG. 11 is a sectional view showing a modification of the support substrate removing step. In this modification, ultraviolet lamps 31 are used to apply ultraviolet light through the chip holding sheet 11 to the adhesive ring 12, thereby curing the adhesive ring 12 to remove the adhesive force of the adhesive ring 12. As a result, the chip holding sheet 11 can be separated from the support substrate 10. In this case, the adhesive ring 12 may be composed of two layers, i.e., an ultraviolet curing adhesive layer attached to the base 15 of the chip holding sheet 11 and an ultraviolet uncuring adhesive layer attached to the bottom of the ring groove 13. In the case that the adhesive ring 12 is composed of these two layers, the adhesive force of the ultraviolet curing adhesive layer is removed by applying the ultraviolet light, but the adhesive force of the ultraviolet uncuring adhesive layer is maintained irrespective of the application of the ultraviolet light. Accordingly, when the chip holding sheet 11 is separated from the support substrate 10 after applying the ultraviolet light to the adhesive ring 12, the adhesive ring 12 can be removed from the base 15 of the chip holding sheet 11 in the condition where the ultraviolet curing adhesive layer cured is attached to the ultraviolet uncuring adhesive layer.

Figure 12:
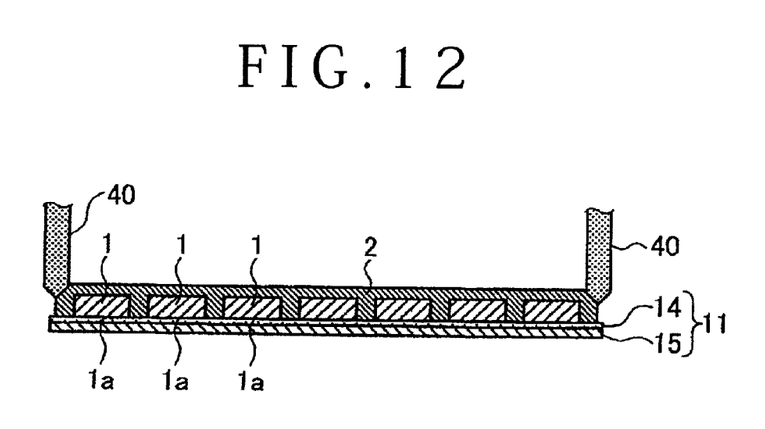
FIG. 12 is a sectional view showing an edge trimming step in the present invention.

Further, in this preferred embodiment, an edge trimming step shown in FIG. 12 may be performed after the resin sealing step and before or after the support substrate removing step. That is, FIG. 12 is a sectional view showing an edge trimming step according to a modification of this preferred embodiment, wherein the edge trimming step is performed after the support substrate removing step and before the grinding step. In this edge trimming step, a cutting blade 40 is used to cut the outer circumferential edge of the mold resin 2, thereby removing burrs from the mold resin 2. Accordingly, damage to the transporting means due to the burrs can be prevented in transporting the mold resin 2 with the semiconductor chips 1 and the chip holding sheet 11.

Further, while the shapes of the support substrate 10 and the chip holding sheet 11 are circular and the shape of the adhesive ring 12 is also circular in this preferred embodiment, the shapes of these members are not limited in the present invention. For example, in the case that the shape of the chip holding sheet 11 is quadrangular, the shape of the adhesive ring 12 may be made quadrangular correspondingly. Thus, the shapes of the support substrate 10 and the chip holding sheet 11 may be set to various shapes such as a rectangular shape, and the shape of the adhesive ring 12 may be set to various ring shapes such as a rectangular ring shape. Further, the application of the resin sealing method of the present invention is not limited to the semiconductor unit 3 as a package, but the present invention is applicable to semiconductor chips for forming any package having various configurations.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A resin sealing method for a plurality of semiconductor chips, comprising:
    a chip holding sheet attaching step of attaching a chip holding sheet through an adhesive ring to a platelike support substrate, said chip holding sheet having a base and an adhesive layer formed on a front side of said base, said adhesive ring having an outer size equal to that of said chip holding sheet, said support substrate having an outer size larger than that of said chip holding sheet;
    a semiconductor chip attaching step of attaching a front side of each semiconductor chip to said adhesive layer of said chip holding sheet in an area corresponding to the inside of said adhesive ring after performing said chip holding sheet attaching step;
    a resin sealing step of sealing all of said semiconductor chips with a mold resin after performing said semiconductor chip attaching step;
    a support substrate removing step of removing an adhesive force of said adhesive ring to said chip holding sheet after performing said resin sealing step, thereby removing said support substrate from said chip holding sheet on which said semiconductor chips are attached and sealed with said mold resin; and
    a chip holding sheet peeling step of peeling said chip holding sheet from the front side of each semiconductor chip sealed with said mold resin after performing said support substrate removing step.

2. The resin sealing method according to claim 1, further comprising a grinding step of grinding said mold resin in the condition where said chip holding sheet is held on a holding table after performing said support substrate removing step, thereby reducing the thickness of said mold resin until each semiconductor chip is exposed.

3. The resin sealing method according to claim 1, wherein said support substrate has a ring groove having a shape corresponding to the shape of said adhesive ring, and said ring groove is filled with said adhesive ring.

4. The resin sealing method according to claim 1, wherein said adhesive ring is mounted on a back side of said base of said chip holding sheet opposite to said adhesive layer along the outer circumference of said base.

5. The resin sealing method according to claim 1, wherein said adhesive ring is formed of an ultraviolet curing adhesive, and said support substrate removing step comprises the step of applying ultraviolet light to said adhesive ring to cure said adhesive ring, thereby removing the adhesive force of said adhesive ring.

6. The resin sealing method according to claim 1, wherein said support substrate removing step comprises the step of cutting said chip holding sheet along the inner circumference of said adhesive ring by using a cutting blade, thereby removing the adhesive force of said adhesive ring.

* * * * *